United States Patent
Wild et al.

(10) Patent No.: US 11,862,913 B2
(45) Date of Patent: Jan. 2, 2024

(54) ELECTRIC CONNECTOR, PRINTED CIRCUIT BOARD ARRANGEMENT AND METHOD FOR ASSEMBLING A PRINTED CIRCUIT BOARD ARRANGEMENT

(71) Applicant: Rosenberger Hochfrequenztechnik Gmbh & Co. KG, Fridolfing (DE)

(72) Inventors: Werner Wild, Buttenwiesen (DE); Johannes Heubeck, Fridolfing (DE); Tobias Stadler, Fridolfing (DE); Andreas Gruber, Ainring (DE)

(73) Assignee: Rosenberger Hochfrequenztechnik Gmbh & Co. KG, Fridolfing (DE)

(*) Notice: Subject to any disclaimer, the term of this patent is extended or adjusted under 35 U.S.C. 154(b) by 297 days.

(21) Appl. No.: 17/485,996

(22) Filed: Sep. 27, 2021

(65) Prior Publication Data

US 2022/0109275 A1  Apr. 7, 2022

(30) Foreign Application Priority Data

Oct. 1, 2020  (EP) .................................... 20199668

(51) Int. Cl.
*H01R 13/00* (2006.01)
*H01R 31/06* (2006.01)
(Continued)

(52) U.S. Cl.
CPC ............ *H01R 31/06* (2013.01); *H01R 43/205* (2013.01); *H05K 1/182* (2013.01); *H01R 12/55* (2013.01); *H05K 2201/10189* (2013.01)

(58) Field of Classification Search
CPC ...... H01R 31/06; H01R 43/205; H01R 12/55; H01R 2103/00; H01R 25/006;
(Continued)

(56) References Cited

U.S. PATENT DOCUMENTS 4,227,765 A * 10/1980 Neumann .............. H01R 24/52
  D13/133
4,428,632 A * 1/1984 Rich .................... H01R 9/0506
  333/260
(Continued)

FOREIGN PATENT DOCUMENTS

JP    2014130846 A   10/2014
WO   2004/012306 A1   2/2004
WO   2013/181146 A1  12/2013

*Primary Examiner* — Abdullah A Riyami
*Assistant Examiner* — Nelson R. Burgos-Guntin
(74) *Attorney, Agent, or Firm* — Donald S. Showalter, Esq.; GrayRobinson, P.A.

(57) ABSTRACT

Embodiments of an electrical connector may have a first end portion on which a first interface is arranged and a second end portion on which a second interface is arranged. The first interface and second interface can each be connected to a respective mating electrical connector. The first interface may form at least two contact element pairs with the second interface, each of the contact element pairs having a first contact element which is associated with the first interface and a second contact element which is mechanically connected to the first contact element and is associated with the second interface. A third interface between the first end portion and the second end portion may electrically and mechanically connect at least one of the contact element pairs to a printed circuit board on which the electrical connector may be mounted.

21 Claims, 12 Drawing Sheets

(51) Int. Cl.
*H01R 43/20* (2006.01)
*H05K 1/18* (2006.01)
*H01R 12/55* (2011.01)

(58) Field of Classification Search
CPC ...... H01R 31/005; H01R 24/50; H01R 12/71; H01R 43/00; H01R 43/16; H05K 1/182; H05K 2201/10189; H05K 1/18; H05K 3/32
See application file for complete search history.

(56) References Cited

U.S. PATENT DOCUMENTS

| | | | | |
|---|---|---|---|---|
| 5,217,391 | A * | 6/1993 | Fisher, Jr. | H01R 24/44 |
| | | | | 439/578 |
| 6,065,976 | A | 5/2000 | Wang | |
| 6,663,424 | B1 * | 12/2003 | Wyse | H01P 5/085 |
| | | | | 333/260 |
| 6,824,392 | B1 * | 11/2004 | Guo | H01R 24/52 |
| | | | | 439/126 |
| 6,835,093 | B1 | 12/2004 | Griffin | |
| 7,830,225 | B2 * | 11/2010 | Gale | H01R 24/547 |
| | | | | 333/136 |
| 9,401,571 | B2 * | 7/2016 | Furukawa | H04N 23/51 |
| 10,424,866 | B1 * | 9/2019 | Peng | H01R 24/50 |
| 2004/0214462 | A1 * | 10/2004 | Huang | H01R 24/46 |
| | | | | 439/188 |
| 2006/0279379 | A1 * | 12/2006 | Gale | H01R 24/547 |
| | | | | 333/131 |
| 2009/0056999 | A1 * | 3/2009 | Kashiwakura | H05K 1/0251 |
| | | | | 174/262 |
| 2014/0148052 | A1 * | 5/2014 | Hall | H01R 13/46 |
| | | | | 439/607.01 |
| 2014/0373345 | A1 * | 12/2014 | Steigerwald | H04N 23/54 |
| | | | | 29/739 |
| 2015/0280373 | A1 * | 10/2015 | Furukawa | H01R 13/46 |
| | | | | 439/578 |
| 2015/0364892 | A1 * | 12/2015 | Patzner | H01R 43/205 |
| | | | | 29/857 |
| 2016/0164197 | A1 * | 6/2016 | Harwath | H04B 5/0012 |
| | | | | 439/578 |
| 2016/0365684 | A1 * | 12/2016 | Li | H05K 1/116 |
| 2018/0287306 | A1 * | 10/2018 | Grimes | H05K 9/0058 |
| 2018/0294583 | A1 * | 10/2018 | Shen | H01R 9/0521 |
| 2019/0103716 | A1 * | 4/2019 | Yamazaki | H01R 13/743 |
| 2019/0221969 | A1 * | 7/2019 | Ruffini | H01R 13/6315 |
| 2019/0288433 | A1 * | 9/2019 | Wang | H01R 13/2478 |
| 2019/0341733 | A1 * | 11/2019 | Stevens | H01R 43/027 |
| 2019/0348804 | A1 * | 11/2019 | Crevenat | H01T 1/16 |

\* cited by examiner

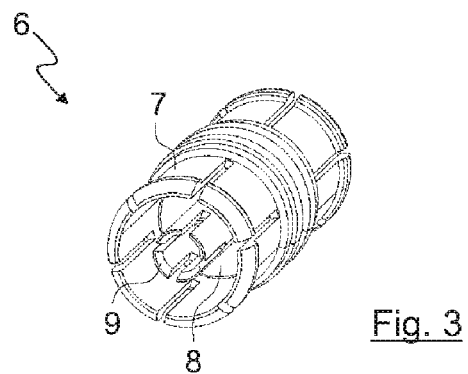
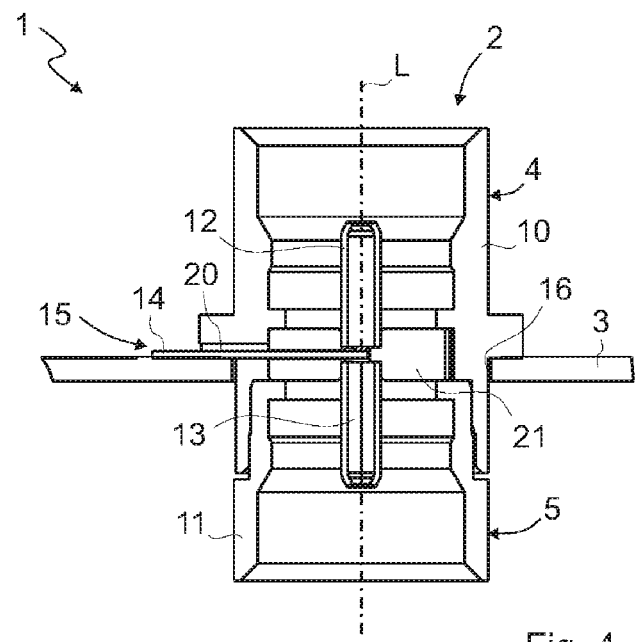

ELECTRIC CONNECTOR, PRINTED CIRCUIT BOARD ARRANGEMENT AND METHOD FOR ASSEMBLING A PRINTED CIRCUIT BOARD ARRANGEMENT

STATEMENT REGARDING FEDERALLY SPONSORED RESEARCH AND DEVELOPMENT

Not applicable.

INCORPORATION BY REFERENCE

European Patent Application No. 20 199 668.3 entitled ELECTRIC CONNECTOR, PRINTED CIRCUIT BOARD ARRANGEMENT AND METHOD FOR ASSEMBLING A PRINTED CIRCUIT BOARD ARRANGEMENT which was filed in the European Patent Office on Oct. 1, 2020 and to which priority is hereby claimed under 35 U.S.C. § 119 is expressly incorporated herein by reference in its entirety to form part of the present disclosure.

FIELD OF INVENTION

The invention relates to the field of electrical connectors. More particularly, one aspect of the invention relates to an electrical connector having a first end portion, on which a first interface is arranged, and having a second end portion, on which a second interface is arranged, wherein the first interface and the second interface can each be connected to an electrical mating connector, and wherein the first interface forms at least two contact element pairs with the second interface.

A further aspect of the invention relates to a printed circuit board arrangement, having an electrical connector and an electric printed circuit board, wherein the connector is received in an opening within the printed circuit board.

Yet another aspect of the invention relates to a method for assembling a printed circuit board arrangement, according to which an electrical connector is guided through an opening in an electric printed circuit board and attached to the printed circuit board.

BACKGROUND

Electronic systems generally have electronic circuits, which are implemented on printed circuit boards (PCBs) via the interconnection of multiple electronic components. Multiple printed circuit boards are often provided within a common electronic system in order to distribute the circuits spatially in a housing, for example, or in order to connect different modules of a modular system to one another. In this construction, an electrical connection between the various printed circuit boards is generally required for signal and/or energy exchange.

In order to electrically connect two printed circuit boards to one another, printed circuit board connectors are often used, which are electrically and mechanically connected to the respective printed circuit board. A connecting element can then be inserted between the two printed circuit board connectors in order to connect the printed circuit board connectors to one another for signal and/or energy transmission. Such connecting elements for connecting the printed circuit board connectors are also known under the terms "adapter" or "bullet connector". The mating connector mentioned below within the context of the invention can preferably be such a connecting element.

For the modularity of the printed circuit board and the flexibility of the printed circuit boards during the assembly of an electronic system, it can be advantageous if the printed circuit boards can be used for establishing contact with the connecting element on both sides. The printed circuit board can therefore be electrically connected to a further printed circuit board located above and/or below the printed circuit board. In addition to the more flexible assembly, the producibility of such a printed circuit board can be more cost-effective since only a single variant of the printed circuit board has to be provided—irrespective of the specific installation situation.

BRIEF SUMMARY OF THE INVENTION

An object of the present invention therefore consists in providing an electrical connector which can preferably be advantageously used as a printed circuit board connector which is accessible on both sides.

A further object of the invention is also to provide a flexibly usable printed circuit board arrangement.

Another object of the invention is moreover to provide an advantageous method for assembling a printed circuit board arrangement.

An electrical connector is provided, having a first end portion, on which a first interface is arranged, and a second end portion, on which a second interface is arranged.

An "end portion" in the sense of the invention preferably extends along a defined portion along the longitudinal axis of the connector, starting from the corresponding end of the connector.

The first end portion preferably comprises the first interface entirely, starting from the first end of the connector, and the second end portion preferably comprises the second interface entirely, starting from the second end of the connector. However, the first interface and/or the second interface can also be arranged axially offset from the respective end of the connector—in which case the interfaces do not necessarily have to be arranged directly at the end of the connector.

The axial length of the end portion preferably corresponds to the axial length of the corresponding interface. However, the interface can also be longer than the end portion associated therewith. Alternatively, the interface can also be shorter than the end portion associated therewith.

The first interface and the second interface can each be connected to an electrical mating connector.

The interfaces can, in particular, form respective plug-in sites for the mating connectors (for plugging-in or inserting the respective mating connector).

The mating connector can preferably be a connecting element for connecting two electric printed circuit boards (also known under the terms "adapter" or "bullet connector"). In particular, to this end, a rigid connecting element can be provided, for example a connecting element having a rigid outer housing or a rigid outer conductor, preferably made of a metal. However, a mating connector can also be a cable connector, which is arranged at one end of an electric cable.

The mating connector can have one or more electrical conductors, in particular an outer conductor and one or more inner conductors. The inner conductor or the inner conductors can be spaced from the outer conductor by an insulator.

Essentially any mating connector can be provided. The mating connector is particularly preferably designed as a coaxial mating connector.

The mating connector can, in particular, have two mutually opposing end portions having respective contact interfaces, wherein the contact interfaces are preferably of an identical type. The contact interfaces can, in particular, form mating plug-in sites for the plug-in sites or interfaces of the connector.

According to the invention, it is provided that the first interface of the connector forms at least two contact element pairs with its second interface. Each of the contact element pairs has a first contact element and a second contact element. The first contact element is associated with the first interface and the second contact element is associated with the second interface. The first contact element is mechanically connected to the second contact element.

An electrical connection can therefore be established between the two interfaces via the mutually connected contact elements of a respective contact element pair.

According to the invention, the electrical connector has a third interface between the first end portion and the second end portion in order to electrically and mechanically connect at least one of the contact element pairs to an electric printed circuit board.

For this reason, the electrical connector can also be referred to as a "printed circuit board connector".

The proposed electrical connector advantageously has, at its end portions or ends, a respective plug-in site or a respective interface into which a mating connector, preferably a connecting element for connecting the connector to a connector of a second printed circuit board, can be plugged.

The contact elements of a common contact element pair can be electrically and mechanically connected to one another between the first interface and the second interface and can moreover be electrically and mechanically connected to the printed circuit board via the third interface.

A particular advantage of the invention is that a mating connector can be connected to the electrical connector starting from any end of the connector (optionally simultaneously from both ends), preferably starting from mutually opposing sides of the printed circuit board.

The first interface is preferably arranged on a first side of the electric printed circuit board and the second interface is preferably arranged on a second side, opposite the first side, of the printed circuit board.

The printed circuit board can thus be optionally electrically connectable to a further printed circuit board arranged above and/or below the printed circuit board. The electrical connector and the printed circuit board equipped with the connector can therefore be used in a particularly modular and flexible manner and can moreover be cost-effectively produced and assembled.

The electrical connector preferably extends through an opening of the electric printed circuit board, particularly preferably in a central portion arranged between the first end portion and the second end portion. However, a central portion can possibly also be omitted—the two end portions or their interfaces can also merge directly into one another.

The electrical connector is particularly preferably mechanically fastened in the opening of the printed circuit board or adjacent to the opening of the printed circuit board. This can take place, for example, by means of a press fit or by means of a material-fitting connection, for example an adhesive connection or a solder connection. Essentially any form-, force- and/or material-fitting fastening can be provided.

The contact elements of a common contact element pair can preferably be connected to traces of the printed circuit board, which are associated with said contact elements, via a common electric line.

It can be provided that the electrical connector is designed to enable simultaneous plugging-in of two mating connectors (i.e. a state having two fully plugged-in mating connectors at each end portion). In this case, the electrical connector can advantageously fulfill a splitter or combiner function.

Alternatively however—depending on the application—it can also be provided that the electrical connector is designed to enable only a single mating connector to be optionally plugged into the first interface or into the second interface. By way of example, the contact element pairs and/or the insulating element described below can be accordingly designed and dimensioned to block the mating connectors from being plugged in with form fit on both sides. This can take place, for example, in that a fully plugged-in mating connector projects with its end into the opposite interface and therefore (at least partially) blocks the plug-in path for a further mating connector.

The electrical connector is preferably connected centrally to the electric printed circuit board along its longitudinal axis, in particular received in the opening of the printed circuit board. The axial lengths of the first end portion and the second end portion and/or the first interface and the second interface are preferably identical.

According to a preferred development of the invention, it can be provided that the electrical connector has a linear or straight extent between the first end portion/first end and the second end portion/second end.

The center axis of the electrical connector preferably extends in a straight or linear manner starting from the first end of the connector to the second end of the connector.

However, an angled, for example stepped, extent between the first end portion/first end and the second end portion/second end can also be provided. By way of example, the connector can be designed to be angled in the manner of a right-angle connector in the region of the first interface and/or in the region of the second interface.

However, a linear or straight extent is preferred, since the electrical connector can then be advantageously suitable for establishing an electrical connection between electric printed circuit boards which are arranged parallel—or at least substantially parallel—to one another.

In an advantageous development of the invention, it can be provided that the first interface and the second interface can each be connected to an electrical mating connector of in identical connector type.

The two plug-in sites or the first interface and the second interface preferably each have an identical mechanical and electrical interface. The first interface and the second interface can therefore have an identical or at least functionally identical construction.

It can essentially also be provided that the first interface and the second interface can each be connected to an electrical mating connector of a different connector type. The first interface and the second interface can therefore optionally also realize different connector standards. However, this variant of the invention is not necessarily preferred.

According to a development of the invention, it can be provided that one of the contact element pairs is designed as an outer conductor contact element pair having a first outer conductor contact element and having a second outer conductor contact element.

The first outer conductor contact element and/or the second outer conductor contact element can preferably be designed in the form of a sleeve, for example in the manner of a tube.

The first outer conductor contact element and/or the second outer conductor contact element can preferably be closed entirely, or at least substantially entirely, along the circumference in order to provide as complete an electromagnetic shielding as possible and good mechanical stability. However, a configuration as a spring cage can essentially also be provided.

The first outer conductor contact element and/or the second outer conductor contact element can optionally have one or more spring tabs for establishing contact with an outer conductor of the mating connector.

The first outer conductor contact element and/or the second outer conductor contact element can preferably be formed entirely or at least partially from a metal or a metal alloy. The first outer conductor contact element and/or the second outer conductor contact element can be designed, in particular, as a punched and bent part, a turned part or a deep drawn component.

Essentially, the use of an outer conductor contact element pair is not absolutely necessary. The electrical connector can also be designed to be unshielded.

According to a development of the invention, it can be provided that one or more further contact element pairs are designed as inner conductor contact element pair(s) having a respective first inner conductor contact element and having a respective second inner conductor contact element.

The electrical connector preferably has precisely one inner conductor contact element pair, which extends within precisely one outer conductor contact element pair. However, the electrical connector can essentially be designed in any manner and, in particular, can have multiple inner conductor contact element pairs, for example two, three, four, five, six or even more inner conductor contact element pairs. The inner conductor contact element pairs can be arranged within a common outer conductor contact element pair or such that they are distributed over multiple outer conductor contact element pairs (if multiple outer conductor contact elements are provided).

According to a development of the invention, it can be provided that the longitudinal axes of the two outer conductor contact elements of the outer conductor contact element pair extend coaxially. It can moreover be provided that the longitudinal axes of the inner conductor contact elements of a respective inner conductor contact element pair extend coaxially.

The longitudinal axes can preferably form a linear extent, although they can essentially also have angled portions.

In a development of the invention, it can be provided that precisely one inner conductor contact element pair is arranged coaxially within the outer conductor contact element pair.

Essentially any number of outer conductor contact element pairs and inner conductor contact element pairs having a preferably coaxial alignment can be provided. By way of example, the electrical connector can also be designed in the manner of a triaxial connector.

However, the electrical connector does not necessarily have to have a coaxial design.

In a development of the invention, it can be provided that the inner conductor contact elements are designed as pin contacts or as socket contacts.

The inner conductor contact elements (pin contacts or socket contacts) can have spring tabs, for example spring tabs connected on one side or on both sides, in order to enable or improve the contact with a corresponding conductor of the mating connector. However, the use of spring tabs is not absolutely necessary, in particular if the corresponding conductor of the mating connector has spring tabs.

In an advantageous development of the invention, it can be provided that the two contact elements of a common contact element pair are formed in one part or in two parts.

The inner conductor contact elements of a common inner conductor contact element pair are preferably formed in one part. However, a multi-part construction of the inner conductor contact elements can also be provided.

The outer conductor contact elements of a common outer conductor contact element pair are preferably formed in multiple parts in order to simplify the assembly on the electric printed circuit board. However, a one-part configuration of the outer conductor contact elements can also be provided.

When using a multi-part outer conductor contact element pair, it can be provided that the outer conductor contact elements are connected to one another using the insulating part mentioned below. Alternatively or additionally, provision can be made to fasten the outer conductor contact elements of a multi-part outer conductor contact element pair by flange-connecting them to one another, in particular if the outer conductor contact elements are designed as deep drawn parts.

Essentially any connecting technique can be provided to connect the contact elements of a multi-part contact element pair to one another (with form fit, force fit and/or material fit).

In an advantageous development of the invention, it can be provided that the third interface for connecting the at least one contact element pair to the electric printed circuit board has at least one contacting means for each contact element pair. The contacting means preferably extends away from the longitudinal axis of the connector, starting from the respective contact element pair.

The at least one contacting means or the third interface therefore extends preferably in the radial direction, particularly preferably orthogonally to the longitudinal axis of the connector, in particular orthogonally to a plug-in direction of the mating connector into the first interface or into the second interface.

The third interface can be designed to realize a transition between a first line system (preferably a coaxial line system), which is formed between the first interface and the second interface, and a second line system (preferably a non-coaxial line system).

The third interface is preferably designed to differ electrically and mechanically from the first interface and the second interface. In particular, it can be provided that the third interface cannot be connected to a mating connector. The third interface preferably does not form a plug-in site.

In a development of the invention, it can be provided that the third interface has at least one contact body, in particular that the at least one contacting means is designed as a contact body, which extends in the radial direction starting from at least one of the contact elements of a common contact element pair. An oblong contact body is preferably provided, for example a contact tab, a contact pin or an individual line.

At least one of the inner conductor contact elements of a common inner conductor contact element pair preferably has at least one corresponding contact body (preferably precisely one contact body).

An optionally present outer conductor contact element and/or an optionally present insulating element, described in more detail below, can have corresponding feedthroughs for guiding-through the contact body.

The contact body, for example a contact tab, can be attached or soldered to a contact portion, for example to a contact pad or to a solder surface, of the electric printed circuit board. An electrical connection, on the one hand, and also a mechanical connection can thus be established.

A contact element pair can essentially have precisely one contact body or multiple contact bodies. Only one of the contact elements of a common contact element pair preferably has contact bodies, in particular an individual contact body (although optionally also more contact bodies for an improved electrical and mechanical connection to the printed circuit board). It can also be provided that both contact elements of a common contact element pair each have a contact body or multiple contact bodies. By way of example, a contact body can be provided for each contact element.

In a development of the invention, it can be provided that the third interface has at least one solder surface, in particular that the at least one contacting means is designed as a solder surface, which is formed on at least one of the contact elements of a common contact element pair.

At least one of the outer conductor contact elements of a common outer conductor contact element pair preferably has a solder surface for connecting to corresponding contact portions on the electric printed circuit board. A particularly good electrical and mechanical connection between the outer conductor contact element and the electric printed circuit board can thus be provided.

In a development of the invention, it can also be provided that the third interface has at least one pin contact, which is formed on at least one of the contact elements of a common contact element pair. The at least one contacting means is preferably designed as an (angled) contact foot.

By way of example, the first outer conductor contact element and/or the second outer conductor contact element of a common outer conductor contact element pair can have at least one of the said pin contacts, preferably multiple annularly circumferentially arranged pin contacts, particularly preferably in an equidistant or grid-type arrangement.

The pin contacts can be inserted into corresponding contact receptacles, in particular in through-connections (vias) in the printed circuit board and, for example, soldered to the printed circuit board or attached in the respective contact receptacle by means of press fit.

In a development of the invention, it can be provided that the electrical connector has an insulating element, which electrically insulates the contact element pairs from one another and is arranged between the first interface and the second interface (or between the first end portion and the second end portion).

The insulating element can essentially be designed to attach and/or mechanically stabilize the contact elements and to space them apart. The insulating element can preferably serve for spacing and mechanically stabilizing the electrical connector in the transition region between the two plug-in sites or between the first interface and the second interface.

The insulating element can be assembled within the outer conductor contact element with force fit, form fit and/or material fit. One or more inner conductor contact elements can be assembled within the insulating element with force fit, form fit and/or material fit.

The insulating element is preferably pressed into at least one of the outer conductor contact elements of a common outer conductor contact element pair and/or latched to at least one of the outer conductor contact elements. The insulating element can possibly also be injected into an outer conductor contact element pair.

In an advantageous development of the invention, it can be provided that the insulating element is designed in multiple parts, in particular in two parts.

In the case of a multi-part configuration of the insulating element, the assembly of the at least one inner conductor contact element can be simplified.

By way of example, the insulating element can be formed from a first insulating part and a second insulating part, which can be connected to one another with force fit, form fit and/or material fit. The insulating parts of the insulating element can particularly preferably be latched to one another. To this end, the insulating parts can have corresponding latching hooks and latching openings, for example precisely one latching hook and precisely one latching opening for each insulating part.

However, a one-part configuration of the insulating element can also be provided. In this case, it can be optionally provided that the insulating element has a film hinge or other pivot axis or other joint in order to simplify, or even simply enable, the assembly of an inner conductor contact element.

In an advantageous development of the invention, it can be provided that the insulating element has an annularly circumferential outer sheath.

Multiple webs, preferably three or more webs arranged equidistantly on the outer sheath, particularly preferably four or more webs arranged equidistantly distributed on the outer sheath, can optionally extend from the outer sheath.

Precisely four webs are preferably provided, which are arranged equidistantly distributed on the outer sheath.

The insulating element can be assembled, preferably latched and/or pressed, in an outer conductor contact element by means of the webs.

The webs can be particularly advantageous for enabling twist-proof assembly of the mating connector. The mating connector can have corresponding receiving portions for the webs.

The webs can moreover form stops for the mating connector.

In an advantageous development of the invention, it can be provided that the insulating element forms an end-face stop for the mating connector.

In particular, it can be provided that the insulating element forms an end-face stop for an outer conductor of the mating connector. However, a stop for an inner conductor and/or an insulator of the mating connector can also be alternatively or additionally provided by the insulating element of the connector. However, a stop for the outer conductor of the mating connector is preferred.

As a result of the end-face stop, it can be ensured that, even with a skewed alignment of the mating connector, for example caused by vibrations during operation, assembly tolerances and/or mating tolerances, a non-linear transmission behavior (passive intermodulation) is prevented since end-face, sporadic losses of contact during the contacting of the outer conductor cannot occur, in particular if the insulating element blocks end-face contacting between the outer conductor of the mating connector and the outer conductor contact element of the connector.

The electrical connector can be designed in particular as a connector for high-frequency technology (HF connector). The electrical connector can be designed in particular for the transmission of electrical signals in the MHz to THz range, for example for the transmission of electrical signals from 1 MHz to 100 GHz, preferably 5 MHz to 70 GHz. However, the electrical connector can also be used for the transmission of electrical DC signals. In particular, a superimposed signal transmission can be provided, according to which an HF signal is modulated onto a DC signal.

The invention also relates to a printed circuit board arrangement, having an electrical connector according to the preceding and following embodiments and the electric printed circuit board, wherein the connector is received in an opening within the printed circuit board and connected to at least one electric line (in particular a trace) of the printed circuit board via the third interface.

Accessibility on both sides of the electric printed circuit board can be advantageously provided for establishing contact with a further printed circuit board without a respective connector having to be soldered on both sides of the printed circuit board. Double-sided population of the printed circuit board can thus be avoided.

As a result of the inventive connector, it can furthermore be optionally ensured that only a single mating connector is plugged into the connector.

As a result of the inventive printed circuit board arrangement, a particularly cost-effective and flexible board-to-board connection can be created, which enables the same board to be contacted from any side or from both sides.

The longitudinal axis of the electrical connector is preferably aligned orthogonally (or vertically) or at least substantially orthogonally with respect to the mutually opposing main surfaces of the printed circuit board. However, the connector can essentially also be aligned such that it is tilted with respect to the printed circuit board, for example by up to 45°, by up to 20°, by up to 10° or by up to 5° relative to an orthogonal alignment.

The opening in the printed circuit board is preferably designed as a circular bore. However, the opening can essentially have any geometry and can therefore also be designed to be rectangular, for example.

The connection between the printed circuit board and the electrical connector can preferably take place for the at least one contact element pair via a solder connection, although possibly also with force fit by means of contact pressure or by means of any other method.

For the electrical connection, the printed circuit board can have traces/strip conductors in all current technologies (for example simple traces of a printed circuit, but also microstrip lines, coplanar lines etc.). The contacting can preferably take place on a surface of the printed circuit board, but optionally also within the (optionally conductively coated) opening or within a through-connection.

The printed circuit board arrangement can have at least one of the mating connectors, which can be connected, or is connected, to the first interface or the second interface.

The printed circuit board arrangement can have at least one further printed circuit board, which is connected to the above-mentioned printed circuit board via at least one of the mating connectors, To this end, the further printed circuit board preferably also has one of the above-mentioned electrical connectors.

The invention also relates to an electrical connection, having an electrical connector according to the preceding and following embodiments and at least one electrical mating connector, which can be connected to the first interface and/or to the second interface.

The inventive connector is essentially suitable for any applications within electrical engineering as a whole. However, in particular, communications technology and radar technology, especially mobile communications technology, is a particularly advantageous field of application for the invention. Possible applications of the invention can relate, for example, to base stations or other active components of a mobile communications system.

The invention moreover relates to an electrical system, having the printed circuit board arrangement according to the preceding and following embodiments and a further electric printed circuit board, which can be connected to the electric printed circuit board of the printed circuit board arrangement. The electrical system particularly preferably has two printed circuit board arrangements which can be connected to one another via a common mating connector according to the preceding and following embodiments.

The invention also relates to a method for assembling a printed circuit board arrangement, according to which an electrical connector having a first end portion, on which a first interface is arranged, and a second end portion, on which a second interface is arranged, is guided through an opening in an electric printed circuit board and attached to the printed circuit board, wherein the first interface forms at least two contact element pairs with the second interface, wherein each of the contact element pairs has a first contact element, which is associated with the first interface, and a second contact element, which is mechanically connected to the first contact element and is associated with the second interface, and wherein a third interface is provided between the first end portion and the second end portion, via which at least one of the contact element pairs is electrically and mechanically connected to the printed circuit board.

A printed circuit board of an electrical system which has multiple electric printed circuit boards to be connected to one another can preferably be optionally assembled in a first alignment or in a second ("upside down") alignment which is rotated through 180°.

Finally, the invention also relates to a method for producing an electrical connector according to the preceding and following embodiments.

As a manufacturing method for producing the electrical connector and its connector components, forming methods such as punching, bending, deep drawing and injection molding can preferably be used. By way of example, the inner conductor contact element or the inner conductor contact element pair can be produced by means of a punching process, a rolling process, a bending process, a stamping process, a turning process, a deep drawing process and/or a pressing process.

Features which have been described in association with one of the subject matters of the invention, namely realized by the inventive electrical connector, the inventive electrical connection, the inventive printed circuit board arrangement, the inventive electrical system, the inventive method for assembling a printed circuit board arrangement or the inventive method for producing an electrical connector, can also be advantageously applied to the other subject matters of the invention. Likewise, advantages which have been mentioned in association with one of the subject matters of the invention can also be understood in relation to the other subject matters of the invention.

In addition, it should be pointed out that terms such as "comprising", "having" or "with" do not exclude other features or steps. Furthermore, terms such as "a" or "the", which point to steps or features in the singular, do not exclude multiple features or steps—and vice versa.

However, in a puristic embodiment of the invention, it can also be provided that the features introduced into the invention by the terms "comprising", "having" or "with" are listed exhaustively. Accordingly, one or more lists can be considered exhaustive within the context of the invention, for example considered respectively for each claim. The invention can, for example, consist exclusively of the features mentioned in claim 1.

It should be mentioned that descriptions such as "first" or "second" etc. are primarily used to enable differentiation between respective device or method features and should not necessarily mean that features are mutually dependent or relate to one another.

It should furthermore be emphasized that the values and parameters described here include deviations or fluctuations of ±10% or less, preferably ±5% or less, further preferably ±1% or less and especially preferably ±0.1% or less of the value or parameter mentioned in each case, provided these deviations are not ruled out in practice when implementing the invention. The specification of ranges by start and end values also includes all those values and fractions which are included by the range mentioned in each case, in particular the start and end values and a respective median value.

The invention also relates to an electrical or optical connector which is independent of claim 1 and has a first interface and a second interface, wherein the first interface and the second interface can each be connected to a mating connector, and wherein the first interface forms at least one contact element pair with the second interface, wherein the connector is connected to a printed circuit board by means of a third interface. The further features of claim 1 and the dependent claims and the features described in this description relate to advantageous embodiments and variants of this connector.

Exemplary embodiments of the invention are described in more detail below with reference to the drawings.

The figures show preferred exemplary embodiments in each case, in which individual features of the present invention are illustrated in combination with one another. Features of an exemplary embodiment can also be implemented separately from the other features of the same exemplary embodiment and can accordingly be readily combined with features of other exemplary embodiments by a person skilled in the art to give further useful combinations and sub-combinations.

In the figures, functionally identical elements are denoted by the same reference signs.

BRIEF DESCRIPTION OF THE DRAWINGS

Represented schematically:

FIG. 3 shows a perspective detailed illustration of an electrical mating connector of FIG. 1;

FIG. 4 shows the electrical connector and the electric printed circuit board of the first exemplary embodiment in a sectional illustration;

DETAILED DESCRIPTIONS OF PREFERRED EMBODIMENTS

Figure 1:
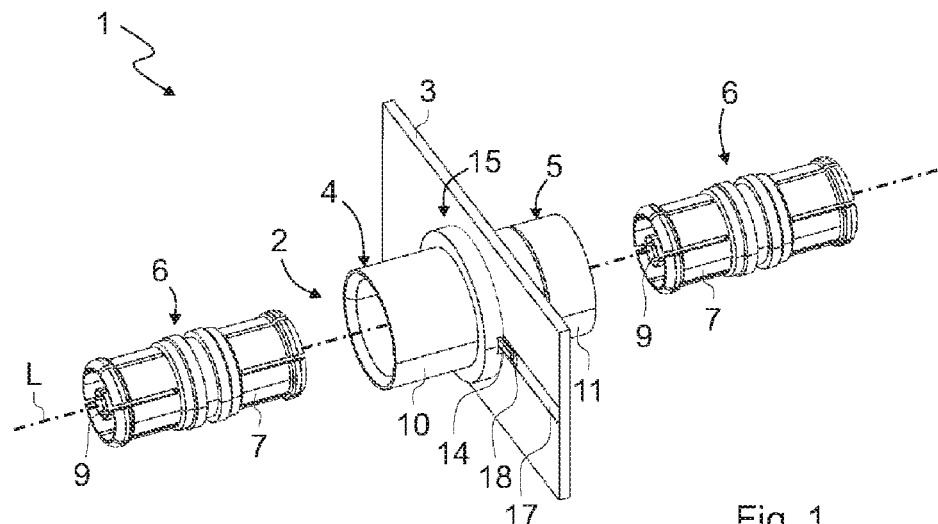
FIG. 1 shows an electrical connector connected to an electric printed circuit board according to a first exemplary embodiment of the invention together with two electrical mating connectors in a perspective illustration.

FIG. 1 shows a printed circuit board arrangement according to a first exemplary embodiment of the invention in a perspective illustration. The printed circuit board arrangement 1 has an electrical connector 2 (printed circuit board connector) and an electric printed circuit board 3.

The electrical connector 2 has a first end portion, on which a first interface 4 or a first plug-in site is arranged. The electrical connector 2 furthermore has a second end portion, on which a second interface 5 or a second plug-in site is arranged. The first interface 4 and the second interface 5 can each be connected to an electrical mating connector 6.

The electrical connector 2 can be designed to optionally enable plugging-in of a mating connector 6 from one of the two sides of the printed circuit board 3 or possibly also simultaneously from both sides of the printed circuit board 3.

An exemplary mating connector 6 corresponding to the connector 2 is shown in a perspective detailed illustration in FIG. 3. The mating connector 6 has an outer conductor 7, which, in the exemplary embodiments, is designed by way of example in the manner of a spring cage in its portions which are provided for contacting purposes. Provided coaxially within the outer conductor 7 is an insulator 8 in which an inner conductor 9 in turn extends coaxially, which inner conductor has, for example, individual spring tabs. Any construction of the mating connector 6 can essentially be provided. The illustrated construction as a connecting element is, in particular, suitable for electrically and mechanically connecting two printed circuit board arrangements 1 to one another by means of a common mating connector 6. A particularly advantageous board-to-board connection can thus be provided. However, the mating connector 6 can also enable a connection of the printed circuit board arrangement 1 to an electric cable or other electric assembly. The mating connector 6 can therefore also be designed, in particular, as a cable connector.

The electrical connector 2 preferably has a linear extent between the first end portion and the second end portion or between the first interface 4 and the second interface 5. The longitudinal axis L of the electrical connector 2 therefore extends linearly. However, the electrical connector 2 can essentially also be designed to be angled or it can have angled portions, for example an angled first end portion or an angled first interface 4 and/or an angled second end portion or an angled second interface 5.

The first interface 4 and the second interface 5 can preferably each be connected to an electrical mating connector 6 of an identical connector type. The first interface 4 and the second interface 5 are therefore designed to be preferably functionally (mechanically and electrically) identical.

Figure 2:
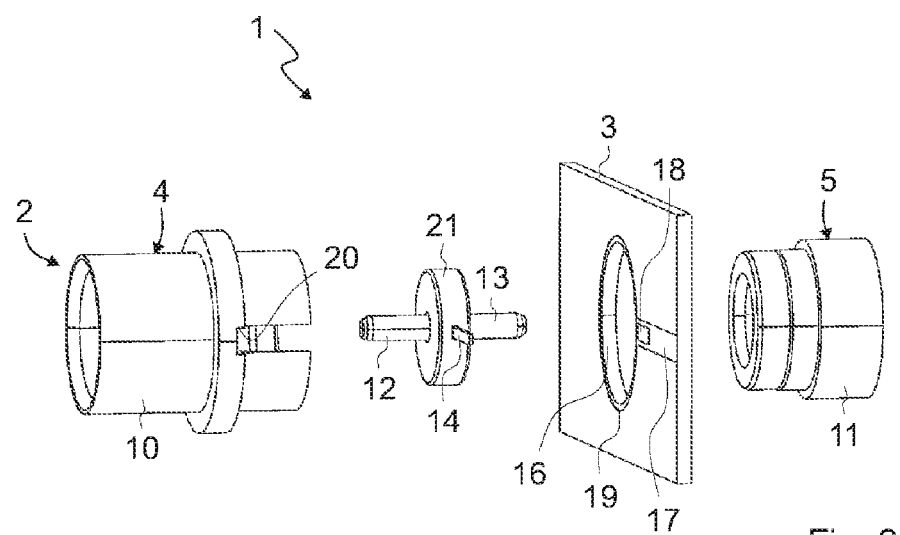
FIG. 2 shows the electrical connector of the first exemplary embodiment in a perspective exploded illustration.

The printed circuit board arrangement 1 and the electrical connector 2 shall be explained in more detail below. To this end, FIG. 2 shows a perspective exploded illustration of the printed circuit board arrangement 1, FIG. 4 a sectional illustration of the printed circuit board arrangement 1, FIG. 5 a sectional illustration of the printed circuit board arrangement 1 with a plugged-in mating connector 6 and FIG. 6 a sectional illustration of the printed circuit board arrangement 1 with two plugged-in mating connectors 6.

The first interface 4 of the electrical connector 2 forms at least two contact element pairs with the second interface 5, wherein each of the contact element pairs has a first contact element 10, 12, which is associated with the first interface 4, and a second contact element 11, 13, which is mechanically connected to the first contact element 10, 12 and is associated with the second interface 5. In the exemplary embodiments, the electrical connector 2 has a coaxial construction—although this is merely exemplary and should not be regarded as restrictive.

In the exemplary embodiments, it is provided that one of the contact element pairs is designed as an outer conductor contact element pair having a first outer conductor contact element 10 and having a second outer conductor contact element 11.

The electrical connector 2 of the first exemplary embodiment has a two-part outer conductor contact element pair. However, the outer conductor contact elements 10, 11 of a common outer conductor contact element pair can essentially also be formed in one part (compare for example FIGS. 16 and 17 described below).

A second contact element pair is designed as an inner conductor contact element pair having a respective first inner conductor contact element 12 and a respective second inner conductor contact element 13. The inner conductor contact element pair is arranged coaxially within the outer conductor contact element pair, wherein the longitudinal axes of the two outer conductor contact elements 10, 11 of the outer conductor contact element pair extend coaxially and the longitudinal axes of the inner conductor contact elements 12, 13 of the inner conductor contact element pair likewise extend coaxially.

In the exemplary embodiments, the outer conductor contact elements 10, 11 are each designed in the form of a sleeve, although they can essentially be configured in any manner.

The inner conductor contact elements 12, 13 can likewise be configured in any manner. By way of example, the inner conductor contact elements 12, 13 according to the first embodiment and the second, third and fourth embodiment of the invention, described below, are designed as pin contacts.

The two inner conductor contact elements 12, 13 of the common inner conductor contact element pair are preferably formed in one part.

Figure 7:
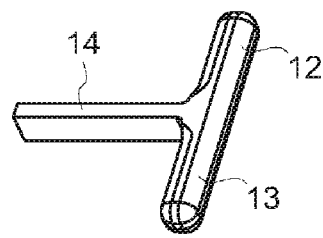
FIG. 7 shows a pin-shaped inner conductor contact element pair according to a first variant of the invention in a perspective detailed illustration.
Figure 8:
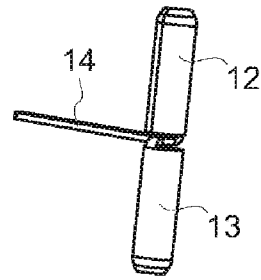
FIG. 8 shows a pin-shaped inner conductor contact element pair according to a second variant of the invention in a perspective detailed illustration.
Figure 9:
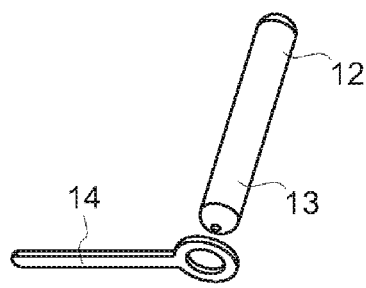
FIG. 9 shows a pin-shaped inner conductor contact element pair according to a third variant of the invention during assembly in a perspective detailed illustration.
Figure 10:
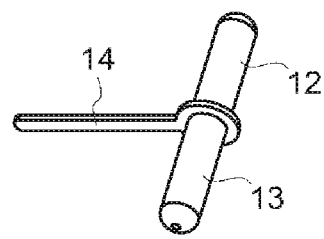
FIG. 10 shows the inner conductor contact element pair of the third variant of the invention after assembly in a perspective detailed illustration.
Figure 11:
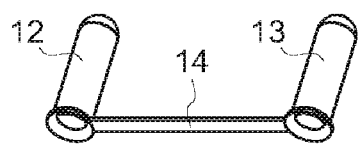
FIG. 11 shows a pin-shaped inner conductor contact element pair according to a fourth variant of the invention during assembly in a perspective detailed illustration.
Figure 12:
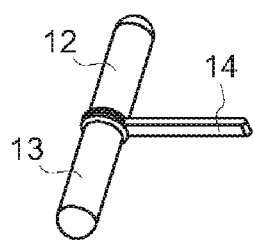
FIG. 12 shows the inner conductor contact element pair of the fourth variant of the invention after assembly in a perspective detailed illustration.

Possible variants for producing a one-part inner conductor contact element pair designed as a pin contact are shown in FIGS. 7 to 12. By way of example, an inner conductor contact element pair can be produced by the method sequence of punching and stamping, as shown in FIG. 7. Alternatively, an inner conductor contact element pair illustrated in FIG. 8 can be produced by the method steps of punching, rolling and bending. Alternatively, it can in turn be provided that the contact body 14, described in more detail below, of the inner conductor contact element pair is produced as a punched part and the pin contact is produced as a turned part, which are then press-connected to one another as shown when FIGS. 9 and 10 are viewed together. Provision can furthermore also be made to produce an inner conductor contact element pair by deep drawing and subsequent bending, as revealed with the aid of FIGS. 11 and 12.

The inventive electrical connector 2 has a third interface 15 between the first end portion and the second end portion (or between the first interface 4 and the second interface 5) in order to electrically and mechanically connect at least one of the contact element pairs, preferably the inner conductor contact element pair and the outer conductor contact element pair, in each case to the printed circuit board 3. The third in each case interface 15 is preferably arranged centrally between the first interface 4 and the second interface 5.

The electrical connector 2 is preferably received in an opening 16 of the printed circuit board 3 (the opening 16 can be clearly seen in FIG. 2, for example).

To connect the contact element pairs to the electric printed circuit board 3, the third interface 15 has corresponding contacting means 14 which extend away from the longitudinal axis L of the connector 2 starting from the respective contact element pair. In the exemplary embodiments, the contacting means connecting the inner conductor contact element pair to the printed circuit board 3 is designed by way of example as a contact body 14, which extends in the radial direction starting from the first inner conductor contact element 12 of the inner conductor contact element pair. The contact body 14 can be connected to a trace 17 (only shown in FIGS. 1 and 2 for simplification) of the printed circuit board 3, in particular soldered to a contact portion 18 (e.g. a solder surface) of the printed circuit board 3. However, any contacting type for establishing contact between one or more inner conductor contact elements 12, 13 and the printed circuit board 3 can essentially be provided.

At this point, it should be mentioned that the inner conductor contact element pair can essentially have any number of contact bodies 15, for example a contact body 14 on each side of the printed circuit board 3 or a contact body 14 starting from each of the inner conductor contact elements 12, 13 of the common inner conductor contact element pair. An annularly circumferential arrangement of multiple contact bodies 14 can also be provided.

To connect the outer conductor contact element pair to the electric printed circuit board 3, it can be provided that the outer conductor contact element pair has at least one solder surface, which can be connected to a corresponding solder surface 19 of the printed circuit board 3 (compare also FIG. 2). Alternatively or additionally, at least one of the outer conductor contact elements 10, 11 can also have, for example, one or more pin contacts (not illustrated), which can be inserted into corresponding contact openings of the printed circuit board 3. Any connecting techniques are essentially possible for connecting the outer conductor contact element pair to the electric printed circuit board 3.

In order to enable the contacting of the inner conductor contact element pair by means of the contact body 14, the outer conductor contact element pair has a corresponding feedthrough 20.

As is revealed particularly clearly with the aid of FIG. 2, the electrical connector 2 has an insulating element 21, which electrically insulates the contact element pairs from one another and is arranged between the first interface 4 and the second interface 5. The insulating element 21 can be formed in one part or in two parts.

Figure 13:
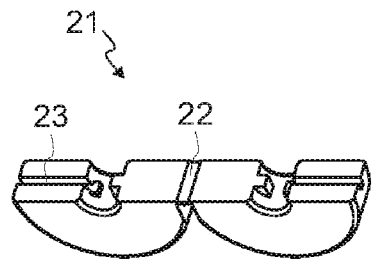
FIG. 13 shows a one-part insulating element for receiving an inner conductor contact element pair with a film hinge in an open state in a perspective detailed illustration.
Figure 14:
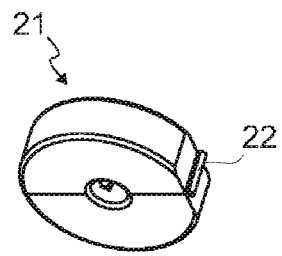
FIG. 14 shows the insulating element of FIG. 13 in a closed state in a perspective detailed illustration.

By way of example, in the first exemplary embodiment, a one-part insulating element 21, illustrated separately in FIGS. 13 and 14, is provided. For assembly of the inner conductor contact element pair, the one-part insulating element 21 has a film hinge 22. FIG. 13 shows an open state of the insulating element 21 and FIG. 14 a closed state. In order to enable the contact body 14 to be guided through the insulating element 21, the insulating element 21 has a corresponding guide channel 23. The insulating element 21 preferably has an annularly circumferential outer sheath.

Figure 5:
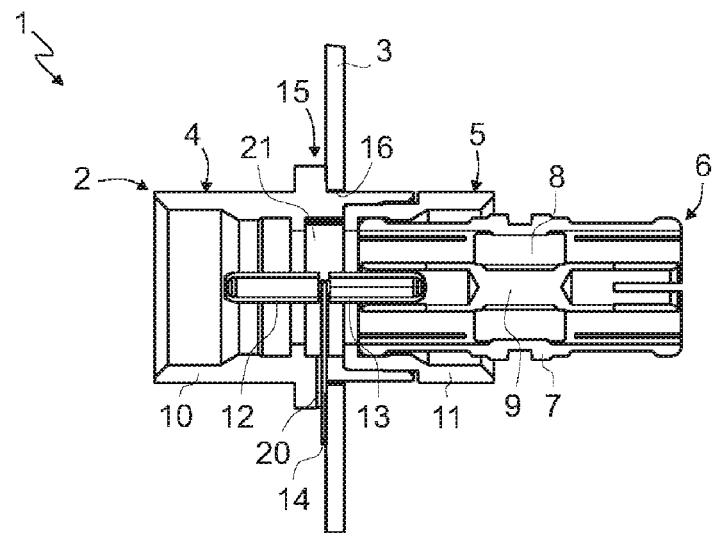
FIG. 5 shows the electrical connector and the electric printed circuit board of the first exemplary embodiment in a sectional illustration together with a plugged-in mating connector.
Figure 6:
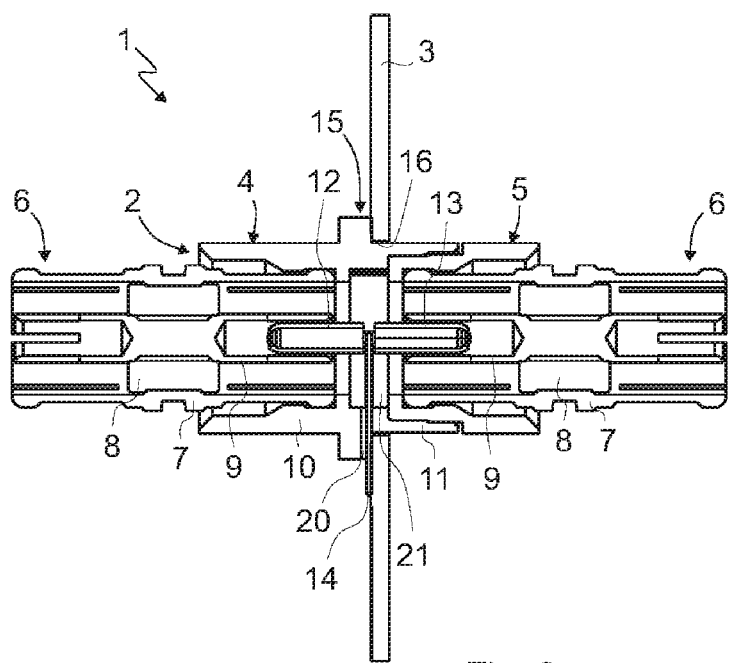
FIG. 6 shows the electrical connector and the electric printed circuit board of the first exemplary embodiment in a sectional illustration together with two plugged-in mating connectors.

The electrical connector 2 of the first exemplary embodiment is designed to optionally enable contact with a mating connector 6 to be established from one of the two sides of the printed circuit board 3 (compare for example FIG. 5). However, in the case of the connector 2 of the first exemplary embodiment, it is also possible to establish contact with two main connectors 6 on both sides, as revealed with the aid of FIG. 6.

Figure 15:
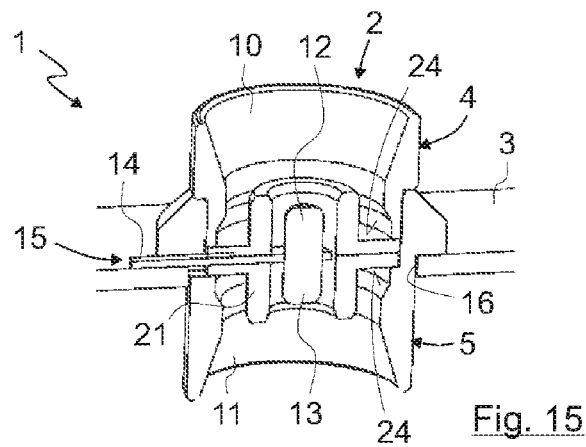
FIG. 15 shows an electrical connector connected to an electric printed circuit board according to a second exemplary embodiment of the invention in a perspective sectional illustration.

In FIG. 15, a second exemplary embodiment of an inventive printed circuit board arrangement 1 is illustrated, in which the insulating element 21 sheathes the inner conductor contact element pair entirely in the longitudinal direction.

At this point, it should be mentioned that features which have already been mentioned and described in association with another exemplary embodiment will essentially not be explained in detail again and, for simplification, substantially only the differences between the exemplary embodiments will be discussed. In this case, a combination of features of the different exemplary embodiments is possible provided this is not ruled out for technical reasons.

Figure 16:
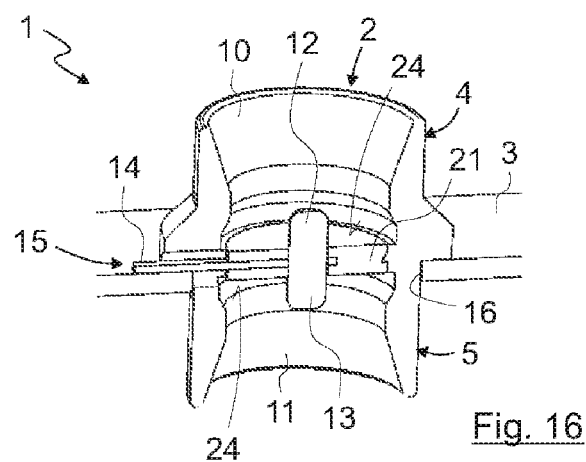
FIG. 16 shows an electrical connector connected to an electric printed circuit board according to a third exemplary embodiment of the invention in a perspective sectional illustration.
Figure 17:
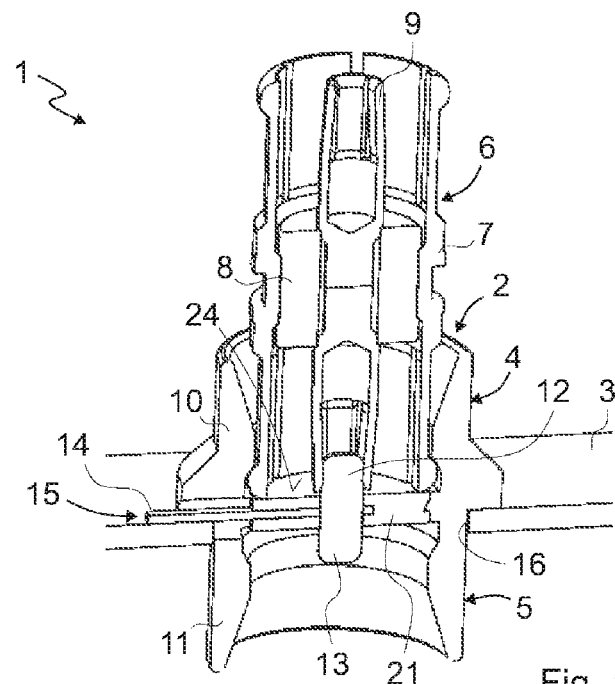
FIG. 17 shows the electrical connector of the third exemplary embodiment with a plugged-in mating connector in a perspective sectional illustration.

A further exemplary embodiment of an inventive printed circuit board arrangement 1 is shown in FIGS. 16 and 17. The electrical connector 2 of the third exemplary embodiment has a one-part outer conductor contact element pair.

In FIG. 17, the connection of a mating connector 6 to the electrical connector 2 of the third exemplary embodiment of FIG. 16 is shown. As is revealed particularly clearly with the aid of FIG. 16, the insulating element 21 has an end-face stop 24 for the mating connector 6 (this also applies to the connector 2 of the second and fourth exemplary embodiments). It can thus be prevented that a loss of contact, resulting in a non-linear transmission behavior, occurs between the outer conductor 7 of the mating connector 6 and the outer conductor contact element 10, 11 of the connector 2 as a result of mechanical jiggling at an end-face contact point. An electrical connector 2 can therefore be provided in which a passive intermodulation is prevented, since only lateral contacting is provided between the outer conductor 7 of the mating connector 6 and the outer conductor contact element 10, 11 of the connector 2.

Figure 18:
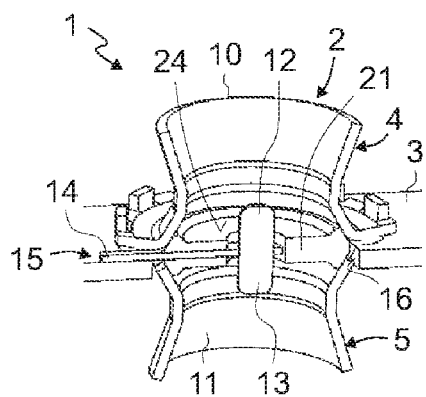
FIG. 18 shows an electrical connector connected to an electric printed circuit board according to a fourth exemplary embodiment of the invention during assembly in a perspective sectional illustration.
Figure 19:
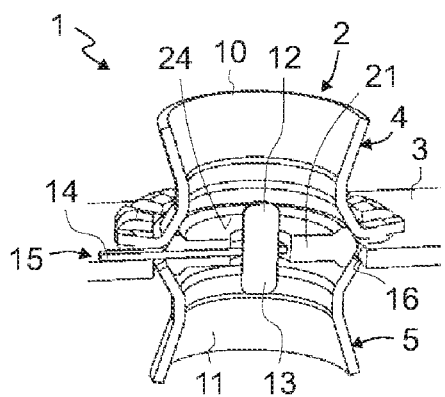
FIG. 19 shows the electrical connector of the fourth exemplary embodiment after assembly in a perspective sectional illustration.

A further exemplary embodiment of the invention is shown in FIGS. 18 and 19. The electrical connector 2 of FIGS. 18 and 19 has a two-part outer conductor contact element pair, which can be mechanically connected to one another via a flange connection.

Figure 20:
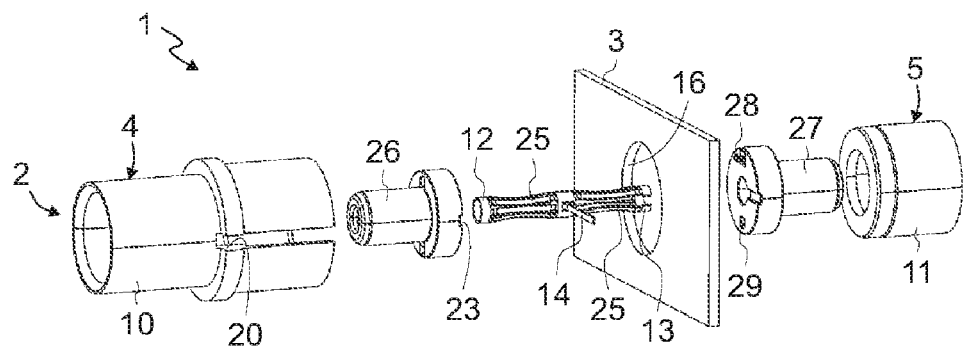
FIG. 20 shows an electrical connector connected to an electric printed circuit board according to a fifth exemplary embodiment of the invention in a perspective exploded illustration.
Figure 21:
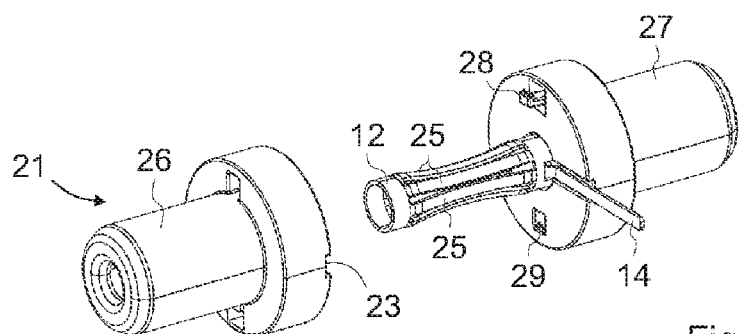
FIG. 21 shows the two-part insulating part of the electrical connector of the fifth exemplary embodiment during the assembly of the inner conductor contact element pair in a perspective illustration.
Figure 22:
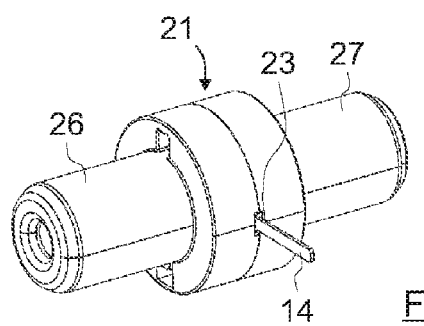
FIG. 22 shows the two-part insulating part of the electrical connector of the fifth exemplary embodiment after the assembly of the inner conductor contact element pair in a perspective illustration.
Figure 23:
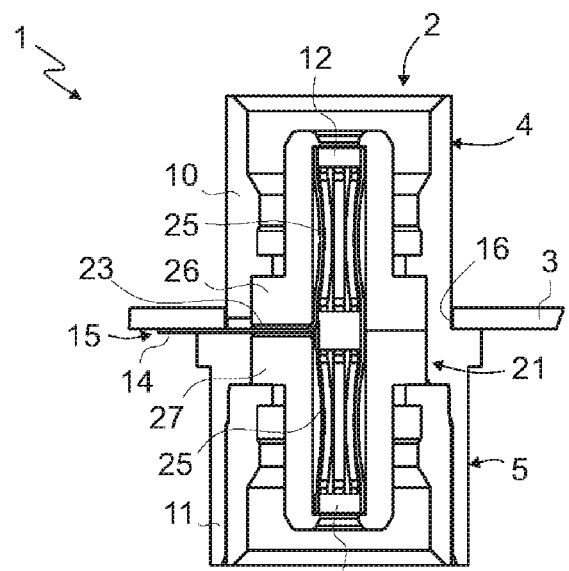
FIG. 23 shows the electrical connector and the electric printed circuit board of the fifth exemplary embodiment in a sectional illustration.
Figure 24:
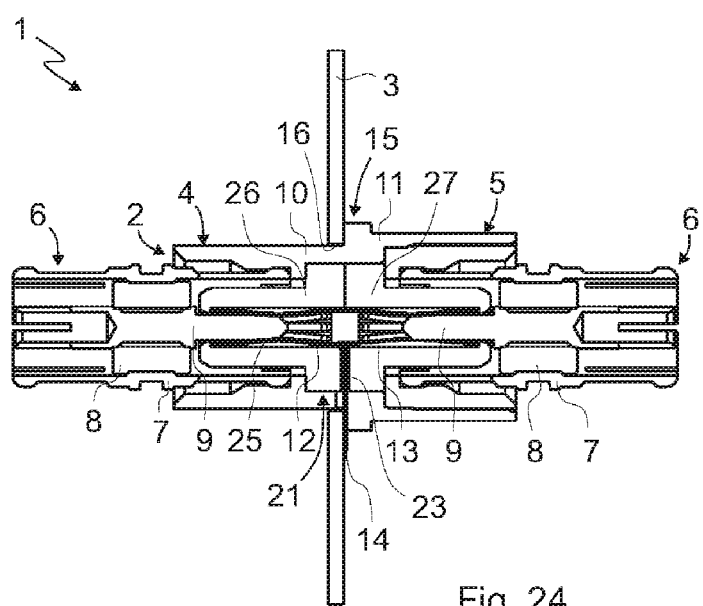
FIG. 24 shows the electrical connector and the electric printed circuit board of the fifth exemplary embodiment in a sectional illustration together with two plugged-in mating connectors.

Finally, a fifth exemplary embodiment of an inventive printed circuit board arrangement 1 is shown in FIGS. 20 to 24. FIG. 20 shows a perspective exploded illustration for this and FIG. 23 shows a cross-section through the printed circuit board arrangement 1. In FIG. 24, the printed circuit board arrangement 1 of the fifth exemplary embodiment, with mating connectors 6 plugged in on both sides, is shown in cross-section.

The electrical connector 2 of the fifth exemplary embodiment has an inner conductor contact element pair, whereof the inner conductor contact elements 12, 13 are designed as socket contacts. The inner conductor contact elements 12, 13 have spring tabs 25 connected on both sides, wherein one of the spring tabs 25 is detached at one end and bent round to form a contact body 14.

The insulating element 21 of the electrical connector 2 of the fifth exemplary embodiment has a two-part construction comprising a first insulating part 26 and a second insulating part 27. Particularly simple assembly of the inner conductor contact element pair can thus take place. The two-part insulating element 21 is shown in a non-assembled state in FIG. 21 and in an assembled state in FIG. 22 together with the inner conductor contact element pair. To connect the two insulating parts 26, 27, a combination of latching hooks 28 and latching openings 29 can be provided, for example. In the exemplary embodiment, it is provided by way of example that each of the insulating parts 26, 27 has a latching hook 28 and a latching opening 29.

Figure 25:
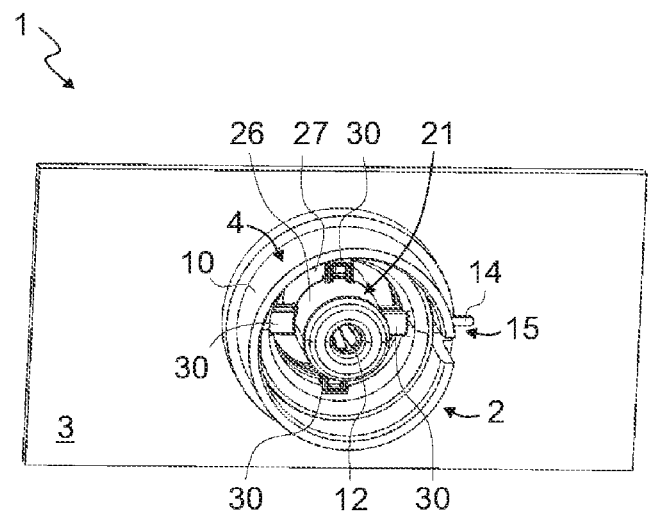
FIG. 25 shows an electrical connector connected to an electric printed circuit board according to a sixth exemplary embodiment of the invention in a perspective illustration.
Figure 26:
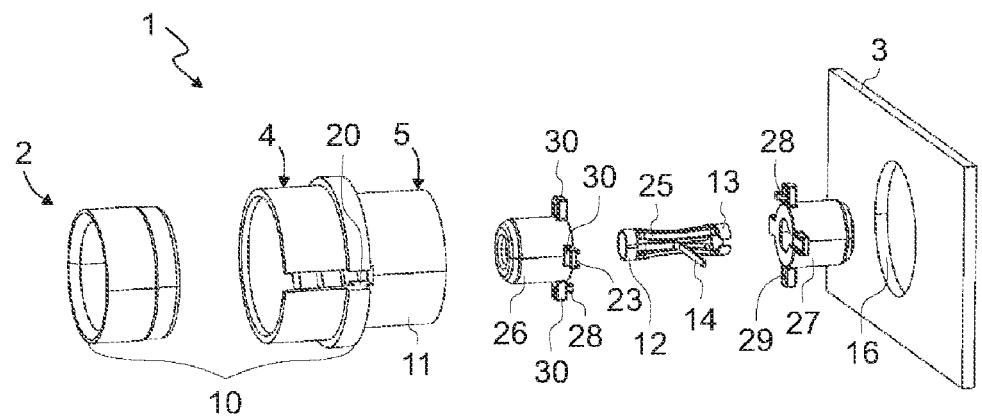
FIG. 26 shows the electrical connector and the electric printed circuit board of the sixth exemplary embodiment in a perspective exploded illustration.
Figure 28:
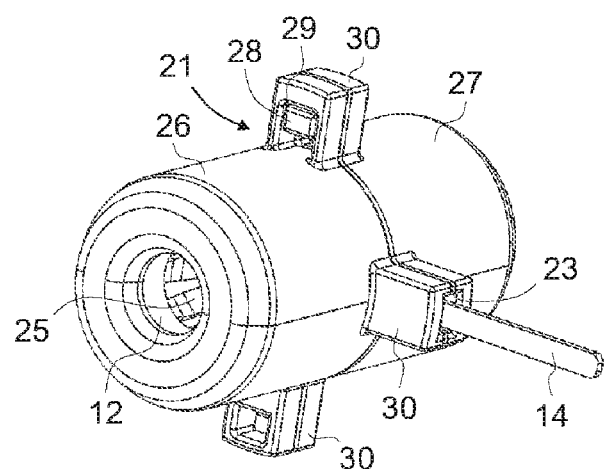
FIG. 28 shows the two-part insulating part of the electrical connector of the sixth exemplary embodiment after the assembly of the inner conductor contact element pair in a perspective illustration.
Figure 29:
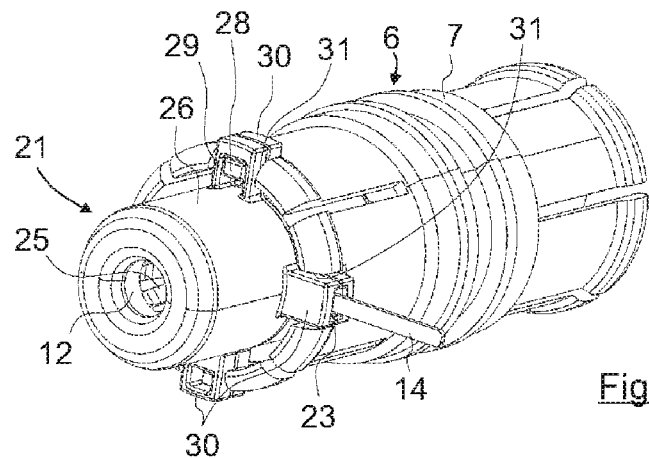
FIG. 29 shows a visualization of the cooperation of the plugged-in mating connector with the two-part insulating part of the electrical connector of the sixth exemplary embodiment in a perspective illustration.
Figure 30:
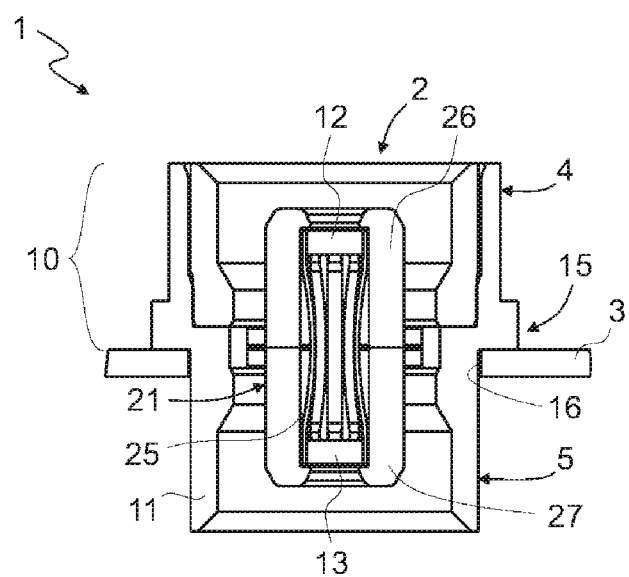
FIG. 30 shows the electrical connector and the electric printed circuit board of the sixth exemplary embodiment in a sectional illustration.
Figure 31:
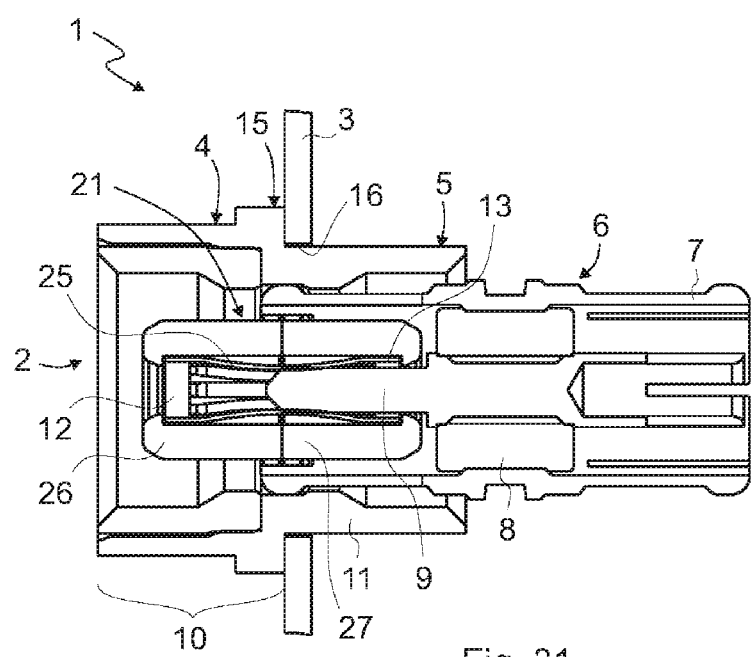
FIG. 31 shows the electrical connector and the electric printed circuit board of the sixth exemplary embodiment in a sectional illustration together with a plugged-in mating connector.

A sixth exemplary embodiment of the inventive printed circuit board arrangement 1 is illustrated in FIGS. 25 to 31. FIG. 25 shows the printed circuit board arrangement 1 in a perspective illustration, with a perspective exploded illustration being shown in FIG. 26. FIG. 30 shows a sectional illustration of the printed circuit board arrangement 1. The electrical connector 2 is furthermore shown in its state connected to the mating connector 6 in a sectional illustration in FIG. 31.

In the sixth exemplary embodiment of the electrical connector 2, an inner conductor contact element pair is in turn provided, which has a socket-like design. The insulating element 21 is formed in two parts from two insulating parts 26, 27. A two-part construction of the outer conductor contact element pair is also provided in the sixth exemplary embodiment of the electrical connector 2. However, this can be assembled starting from the same assembly direction, wherein, before the assembly of the two parts of the outer conductor contact element pair, the insulating element 21 equipped with the inner conductor contact element pair should be inserted into the outer conductor contact element pair.

The insulating element 21 represents a particular feature of the sixth exemplary embodiment. Multiple webs 30 extend from the outer sheath of the insulating element 21. By way of example, precisely four webs 30 are provided, which are arranged equidistantly distributed on the outer sheath.

Figure 27:
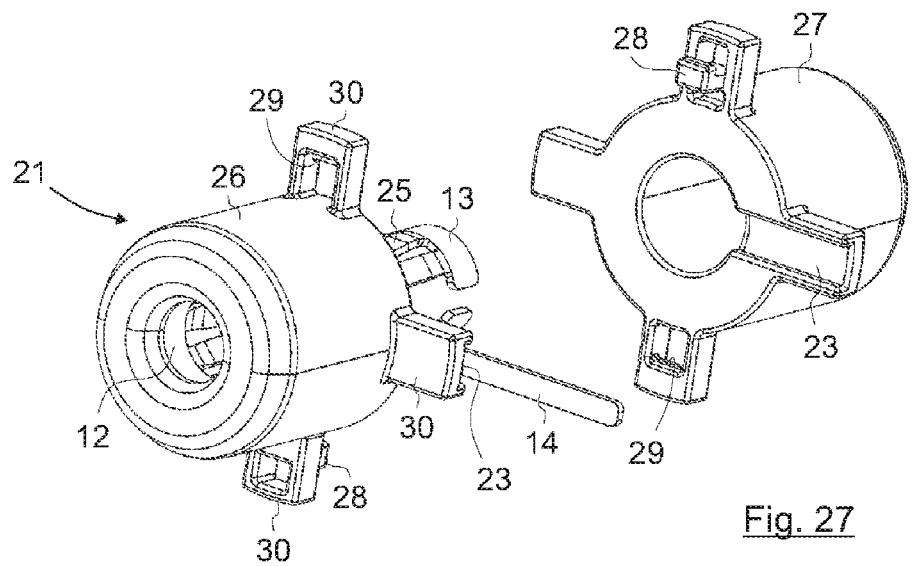
FIG. 27 shows the two-part insulating part of the electrical connector of the sixth exemplary embodiment during the assembly of the inner conductor contact element pair in a perspective illustration.

FIGS. 27 and 28 show the insulating element 21 during assembly in an enlarged detailed illustration together with the inner conductor contact element pair.

To connect the two insulating parts 26, 27, latching hooks 28 and latching openings 29 are in turn provided, which, in the present case, are formed on or in the webs 30. By way of example, each insulating part 26, 27 has precisely one latching hook 28 and one latching opening 29. However, any number of latching hooks 28 and latching openings 29 can essentially be provided and arranged in any distribution.

The webs 30 enable twist-proof fastening of the mating connector 6 in its plugged-in state. To this end, the mating connector 6 can have corresponding receiving portions 31 for the webs 30. FIG. 29 illustrates the principle.

The connector 2 of the sixth exemplary embodiment is designed, for example, to enable a mating connector 6 to only be plugged in from one side of the printed circuit board 3 and to block simultaneous plugging-in of two mating connectors 6. The electrical connector 2 or the contact element pairs and the insulating element 21 are designed such that the mating connector 6, in its fully plugged-in state, projects beyond the central region of the electrical connector 2 and therefore into the opposing interface 4, as revealed particularly clearly with the aid of FIGS. 29 and 31. A further mating connector 6 can therefore not be plugged into the electrical connector 2, at least not fully or with sufficient depth, starting from the opposite side of the printed circuit board 3.

While the invention has been described with reference to various preferred embodiments, it should be understood by those skilled in the art that various changes may be made and equivalents substituted for elements thereof without departing from the scope of the invention. In addition, many modifications may be made to adapt to a particular situation or application of the invention without departing from the scope of the invention. Therefore, it is intended that the invention not be limited to the particular embodiments disclosed but rather, that the invention will include all embodiments falling within the scope of the appended claims, either literally or under the Doctrine of Equivalents.

What is claimed is:

1. An electrical connector which is mountable on a printed circuit board and is electrically and mechanically connectable with both a first mating electrical connector and a second mating electrical connector, said electrical connector comprising:
    a first interface which is arranged on a first end portion of the electrical connector and is electrically and mechanically connectable to the first mating electrical connector;
    a second interface arranged on a second end portion of the electrical connector, and which is electrically and mechanically connectable to the second mating electrical connector; and
    a third interface between the first interface and the second interface; the first interface forming at least two contact element pairs with the second interface, each of the contact element pairs having a respective first electrical contact element which is associated with the first interface, each of the contact element pairs having a respective second contact element which is associated with the second interface and is mechanically connected to the first contact element; the third interface electrically and mechanically connecting at least one of the contact element pairs to the printed circuit board.

2. An electrical connector as claimed in claim 1, wherein the two contact elements of a common contact element pair are formed as one part.

3. An electrical connector as claimed in claim 1, wherein the two contact of a common contact element pair are formed in in two parts.

4. An electrical connector as claimed in claim 1, wherein the first interface and the second interface have a common longitudinal axis.

5. An electrical connector as claimed in claim 4, wherein the third interface has at least one contacting means for each contact element pair, the contact means extending away from the longitudinal axis.

6. An electrical connector as claimed in claim 5, wherein the contacting means is designed as a contact body which extends in the radial direction from at least one of the contact elements of a common contact element pair, the radial direction being orthogonal to the longitudinal axis.

7. An electrical connector as claimed in claim 5, wherein the at least one contacting means is a solder surface which is formed on at least one of the contact elements of a said common contact element pair.

8. An electrical connector as claimed in claim 5, wherein the at least one contacting means is a contact foot which is formed on at least one of the contact elements of a common contact element pair.

9. An electrical connector as claimed in claim 1, wherein the first interface and the second interface are designed as coaxial systems, and the third interface is designed as a non-coaxial system.

10. An electrical connector as claimed in claim 1, wherein the first mating electrical connector and the second mating electrical connector are electrical connectors an identical connector type.

11. An electrical connector as claimed in claim 1, wherein a first one of the contact element pairs is an outer conductor contact element pair, the outer contact element pair having a first outer conductor contact element and a second outer conductor contact element, and wherein a second one of the contact element pairs is an inner conductor contact element pair, the inner contact element pair having a first inner conductor contact element and a second inner conductor contact element.

12. An electrical connector as claimed in claim 11, wherein the two outer conductor contact elements of the outer conductor contact element pair are coaxial with one another in a longitudinal direction, and wherein the inner conductor contact elements of the inner conductor contact element pair are coaxial with one another in the longitudinal direction.

13. An electrical connector as claimed in claim 11, wherein precisely one said inner conductor contact element pair is located coaxially within the outer conductor contact element pair.

14. An electrical connector as claimed in claim 11, wherein the inner conductor contact elements are pin contact.

15. An electrical connector as claimed in claim 11, wherein the inner conductor contact elements are socket contacts.

16. An electrical connector as claimed in claim 1, further comprising an insulating element which electrically insulates the contact element pairs from one another the insulating element being located between the first interface and the second.

17. An electrical connector as claimed in claim 16, wherein the insulating element has an end-face stop for the mating connector.

18. An electrical connector as claimed in claim 16, the insulating element has an annularly circumferential outer sheath, and wherein multiple webs extend from the outer sheath.

19. An electrical connector as claimed in claim 18, wherein and wherein at least three of the webs are equidistantly distributed on the outer sheath.

20. A printed circuit board arrangement which is electrically and mechanically connectable with both a first mating electrical connector and a second mating electrical connector, said printed circuit board arrangement comprising:
a printed circuit board and an electrical connector; the printed circuit board having at least one electric line and an opening in which the electrical connector is received; the electrical connector including a first interface, a second interface and a third interface; the third interface being between the first interface and the second interface; the first interface being electrically and mechanically connectable to the first mating electrical connector, the second interface being electrically and mechanically connectable to the second mating electrical connector; the first interface forming at least two contact element pairs with the second interface, each of the contact element pairs having a respective first electrical contact element which is associated with the first interface, each of the contact element pairs having a respective second contact element which is mechanically connected to the first contact element and is associated with the second interface; the third interface-electrically and mechanically connecting at least one of the contact element pairs to the electrical line of printed circuit board.

21. A method for assembling a printed circuit board arrangement, said method comprising the steps of:
a) providing an electrical connector the electrical connector having (i) a first end portion on which a first interface is arranged, (ii) a second end portion on which a second interface is arranged, and (iii) a third interface between the first interface and the second interface, the first interface forming at least two contact element pairs with the second interface, each of the contact element pairs having a respective first electrical contact element which is associated with the first interface, each of the contact element pairs having a respective second contact element which is mechanically connected to the first contact element and is associated with the second interface;
b) guiding the electrical connector through an opening in an electric printed circuit board;
c) attaching the electrical connector to the printed circuit board through the opening, and
d) electrically and mechanically at least one of the contact element pairs to the printed circuit board by way of the third interface.

* * * * *